(12) United States Patent
Du et al.

(10) Patent No.: US 11,676,663 B2
(45) Date of Patent: *Jun. 13, 2023

(54) CONTROL METHOD AND CONTROLLER OF PROGRAM SUSPENDING AND RESUMING FOR MEMORY

(71) Applicant: YANGTZE MEMORY TECHNOLOGIES CO., LTD., Wuhan (CN)

(72) Inventors: Zhi Chao Du, Wuhan (CN); Yu Wang, Wuhan (CN); Haibo Li, Wuhan (CN); Ke Jiang, Wuhan (CN); Ye Tian, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 0 days.

This patent is subject to a terminal disclaimer.

(21) Appl. No.: 17/573,532

(22) Filed: Jan. 11, 2022

(65) Prior Publication Data

US 2022/0139462 A1 May 5, 2022

Related U.S. Application Data (63) Continuation of application No. 17/187,690, filed on Feb. 26, 2021, now Pat. No. 11,250,914, which is a (Continued)

(51) Int. Cl.
*G11C 16/10* (2006.01)
*G11C 7/12* (2006.01)
(Continued)

(52) U.S. Cl.
CPC ............. *G11C 16/10* (2013.01); *G11C 7/12* (2013.01); *G11C 7/227* (2013.01);
(Continued)

(58) Field of Classification Search
CPC ....... G11C 16/10; G11C 16/3459; G11C 7/12; G11C 7/227; G11C 2216/20; G11C 2207/002
(Continued)

(56) References Cited

U.S. PATENT DOCUMENTS 3,858,060 A 12/1974 Kenyon
4,344,154 A 8/1982 Klaas et al.
(Continued)

FOREIGN PATENT DOCUMENTS

CN 105336367 A 2/2016
CN 107112047 A 8/2017
(Continued)

OTHER PUBLICATIONS

International Search Report issued in correspoding International Application No. PCT/CN2021/094511, dated Aug. 26, 2021, 4 pages.

*Primary Examiner* — Michael T Tran
(74) *Attorney, Agent, or Firm* — Bayes PLLC (57) ABSTRACT

A memory system includes a memory cell array and a controller coupled to the memory cell array. The controller is configured to control applying a first program voltage to a word line to program memory cells in the memory cell array, the memory cells being coupled to the word line, and in response to receiving a suspend command, control applying a positive bias discharge voltage to the word line when the first program voltage ramps down.

20 Claims, 5 Drawing Sheets

Related U.S. Application Data continuation of application No. 16/905,838, filed on Jun. 18, 2020, now Pat. No. 10,978,158, which is a continuation of application No. PCT/CN2020/091037, filed on May 19, 2020.

(51) Int. Cl.
  *G11C 7/22* (2006.01)
  *G11C 16/34* (2006.01)

(52) U.S. Cl.
  CPC .... *G11C 16/3459* (2013.01); *G11C 2207/002* (2013.01); *G11C 2216/20* (2013.01)

(58) Field of Classification Search
  USPC .............. 365/189.05, 228, 185.03, 185.24
  See application file for complete search history.

(56) References Cited

U.S. PATENT DOCUMENTS

| | | | |
|---|---|---|---|
| 5,216,630 A | 6/1993 | Nakase | |
| 5,719,807 A | 2/1998 | Sali et al. | |
| 5,822,252 A | 10/1998 | Lee et al. | |
| 6,031,329 A | 2/2000 | Nagano | |
| 9,030,877 B2 | 5/2015 | Strenz et al. | |
| 10,665,306 B1 | 5/2020 | Chen et al. | |
| 2004/0184331 A1 | 9/2004 | Hanzawa et al. | |
| 2005/0276118 A1 | 12/2005 | Maayan | |
| 2006/0198231 A1* | 9/2006 | Larguier | G11C 11/413 365/230.06 |
| 2006/0215453 A1 | 9/2006 | Seong | |
| 2006/0285388 A1 | 12/2006 | Ha et al. | |
| 2007/0183199 A1 | 8/2007 | Chung | |
| 2007/0297242 A1 | 12/2007 | Kuriyama | |
| 2008/0180997 A1 | 7/2008 | Park et al. | |
| 2008/0239847 A1 | 10/2008 | Jung et al. | |
| 2009/0168535 A1* | 7/2009 | Kim | G11C 16/26 365/185.18 |
| 2012/0092922 A1* | 4/2012 | Suzuki | G11C 29/12 365/154 |
| 2012/0257450 A1 | 10/2012 | Yip | |
| 2013/0205085 A1 | 8/2013 | Hyun | |
| 2013/0283872 A1 | 10/2013 | Bisson et al. | |
| 2013/0326162 A1* | 12/2013 | Moon | G06F 12/0804 711/154 |
| 2013/0326163 A1* | 12/2013 | Moon | G11C 11/408 711/154 |
| 2014/0317344 A1* | 10/2014 | Kim | G11C 8/10 711/105 |
| 2014/0369134 A1 | 12/2014 | Baik et al. | |
| 2016/0012891 A1 | 1/2016 | Intrater et al. | |
| 2016/0172042 A1 | 6/2016 | Kang | |
| 2016/0314826 A1* | 10/2016 | Augustine | G11C 11/1657 |
| 2017/0301403 A1 | 10/2017 | Pang et al. | |
| 2018/0151237 A1* | 5/2018 | Lee | G11C 16/16 |
| 2018/0197610 A1* | 7/2018 | Lee | G11C 16/0483 |
| 2018/0204620 A1 | 7/2018 | Kim et al. | |
| 2019/0171360 A1* | 6/2019 | Lee | G11C 16/26 |
| 2019/0325962 A1 | 10/2019 | Sheikh et al. | |
| 2019/0333592 A1 | 10/2019 | Lee et al. | |
| 2019/0333593 A1 | 10/2019 | Lee et al. | |
| 2020/0160910 A1 | 5/2020 | Hsu | |
| 2020/0243145 A1 | 7/2020 | Yamada | |
| 2020/0294571 A1 | 9/2020 | Shin | |
| 2020/0350029 A1* | 11/2020 | Kim | G11C 16/10 |
| 2021/0183450 A1* | 6/2021 | Sharma | G11C 16/16 |

FOREIGN PATENT DOCUMENTS

| | | |
|---|---|---|
| CN | 110033808 A | 7/2019 |
| WO | 2016069487 A1 | 5/2016 |

* cited by examiner

CONTROL METHOD AND CONTROLLER OF PROGRAM SUSPENDING AND RESUMING FOR MEMORY

CROSS REFERENCE TO RELATED APPLICATIONS

This application is a continuation of U.S. application Ser. No. 17/187,690, filed Feb. 26, 2021, issued as U.S. Pat. No. 11,250,914, which is a continuation of U.S. application Ser. No. 16/905,838, filed Jun. 18, 2020, issued as U.S. Pat. No. 10,978,158, which is a continuation of International Application No. PCT/CN2020/091037, filed May 19, 2020, all of which are incorporated herein by reference in their entireties.

BACKGROUND

The present disclosure relates to a control method and controller, and more particularly, to a control method and controller of program suspending and resuming for memory.

Semiconductor memories are widely used in various electronic devices such as cellular phones, digital cameras, personal digital assistants, medical electronic devices, mobile computing devices and non-mobile computing devices. A nonvolatile memory allows information to be stored and retained. Examples of the nonvolatile memory comprise a flash memory (e.g., NAND type and NOR type flash memory) and electrically erasable programmable read only memory (Electrically Erasable Programmable Read-Only Memory, EEPROM), etc.

In the nonvolatile memory, each memory element is configured to store a charge, voltage, or other electrical parameter to represent the data in a plurality of bit-cells (or memory elements), formed from floating-gate transistors. Program operations typically occur in groups or pages of multiple memory cells. Read operations may occur in pages of memory cells or in smaller sets of memory cells. However, with the increasing number of cells in each page, the program operation may need to be suspended immediately upon receipt of the read command.

SUMMARY

It is, therefore, a primary objective of the present disclosure to provide a control method and controller of program suspending and resuming for memory to improve over disadvantages of the prior art.

An embodiment of the present disclosure discloses a control method, for a memory array, the control method comprising programming the bit-cell of the memory array in a programming stage; and discharging the bit-cell of the memory array in a discharge stage; wherein the programming stage comprises: programming the bit-cell of the memory array with a plurality of programming voltage pulses; wherein the discharge stage comprises: isolating a select line of the bit-cell of the memory array; and generating a programming voltage pulse to the bit-cell of the memory array; wherein the programming stage can be suspended to a suspend stage by a suspend command after the discharge stage; wherein the suspend command is received during one of the plurality of programming voltage pulse.

An embodiment of the present disclosure further discloses a controller for programming a memory array, the controller for programming a memory array comprising a storage unit, configured to store a program code; and a processing unit, configured to perform the following steps: programming the bit-cell of the memory array in a programming stage; and discharging the bit-cell of the memory array in a discharge stage; wherein the programming stage comprises: programming the bit-cell of the memory array with a plurality of programming voltage pulses; wherein the discharge stage comprises: isolating a select line of the bit-cell of the memory array; and generating a programming voltage pulse to the bit-cell of the memory array; wherein the programming stage can be suspended to a suspend stage by a suspend command after the discharge stage.

These and other objectives of the present disclosure will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to." Also, the term "couple" is intended to mean either an indirect or direct electrical connection. Accordingly, if one device is electrically connected to another device, that connection may be through a direct electrical connection, or through an indirect electrical connection via other devices and connections. "Roughly" means that within the acceptable error budgets, those skilled in the art can solve the technical problem within a certain error budgets, and basically achieve the technical effect.

While many embodiments are described herein, at least some of the described embodiments facilitate program suspend/resume operations for an electronic storage device. In other words, a programming (or other equivalents) operation that is being processed at non-volatile memory (NVM) may be suspended, either temporarily or permanently, in order to allow one or more other memory access operations (e.g., read, erase, partial program, etc.) to be processed at the NVM. As used herein, the term "program operation"

includes any operation to persist a value (digital or analog), or to persist a state which represents a value, on the NVM. Some examples of other programs (or equivalents) operations include, but are not limited to, burning, storing, writing, and setting a persistent value on the NVM. References herein to a program operation are inclusive of other equivalent or similar operations. References herein to "suspending" are inclusive of other equivalent or similar terms, including, but not limited to, pausing, interrupting, queuing, and delaying.

A memory includes a memory array, including many pages of memory elements. Each memory element is configured to store a charge, voltage, or other electrical parameters to represent the data. However, with the increasing number of cells in each page, the programming time is increasing, too. Therefore, the gap in idle in which the memory can serve the read command between each programming command is decreasing, and it is a problem that there is a need for a suspend command when the memory is executing programming command.

Figure 1:
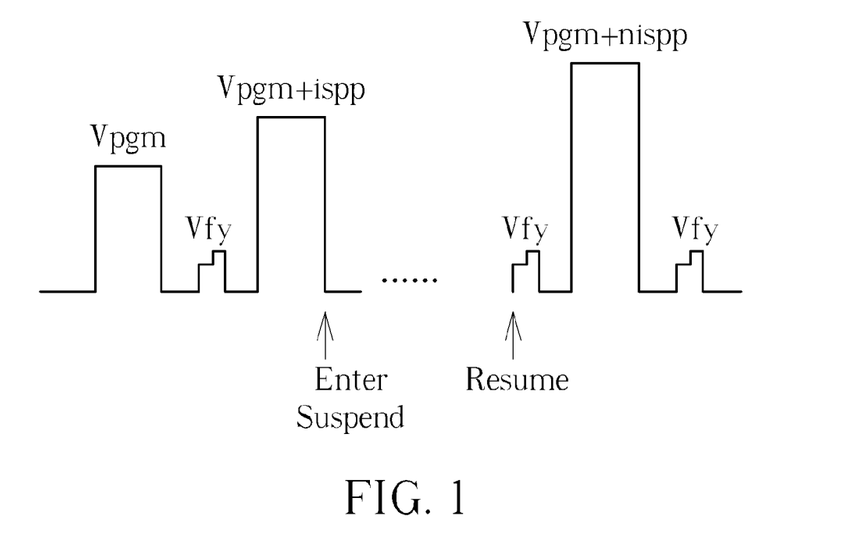
FIG. 1 is a schematic diagram of waveforms of a programming process for a memory array in the prior art.

More specifically, FIG. 1 is a schematic diagram of waveforms of a programming process for a memory array in the prior art. As can be seen, a programming process comprises a plurality of programming voltage pulses in a plurality of programming stages, wherein the voltages of the plurality of programming voltage pulses are increased by the value ispp. Moreover, a verification stage is required to verify whether the programming is successful or not.

In other words, the program process may be performed using incremental voltage pulses, which incrementally increase the voltage level of value to each voltage pulse, which increases the voltage level in value of ispp to store logic 0 or 1 in the bit-cell of the memory array until passing the verification. If then the verification fails, another programming voltage pulse with a higher voltage level is applied to program the bit-cell of the memory array.

In addition, the program suspending operation may be performed to suspend a program (or write or other equivalents) operation on a given page of memory elements in order to read data from one of the memory elements as the group of bit-cells of the memory array is programmed. A programming voltage pulse count corresponding to the current program operation is stored before suspending the program operation, so as to make the memory array idle, which may serve the interrupted command, such as read command, and then continue to the programming stage, wherein the voltage level of the programming voltage pulse is based on the programming voltage pulse count stored before the suspending.

Figure 2:
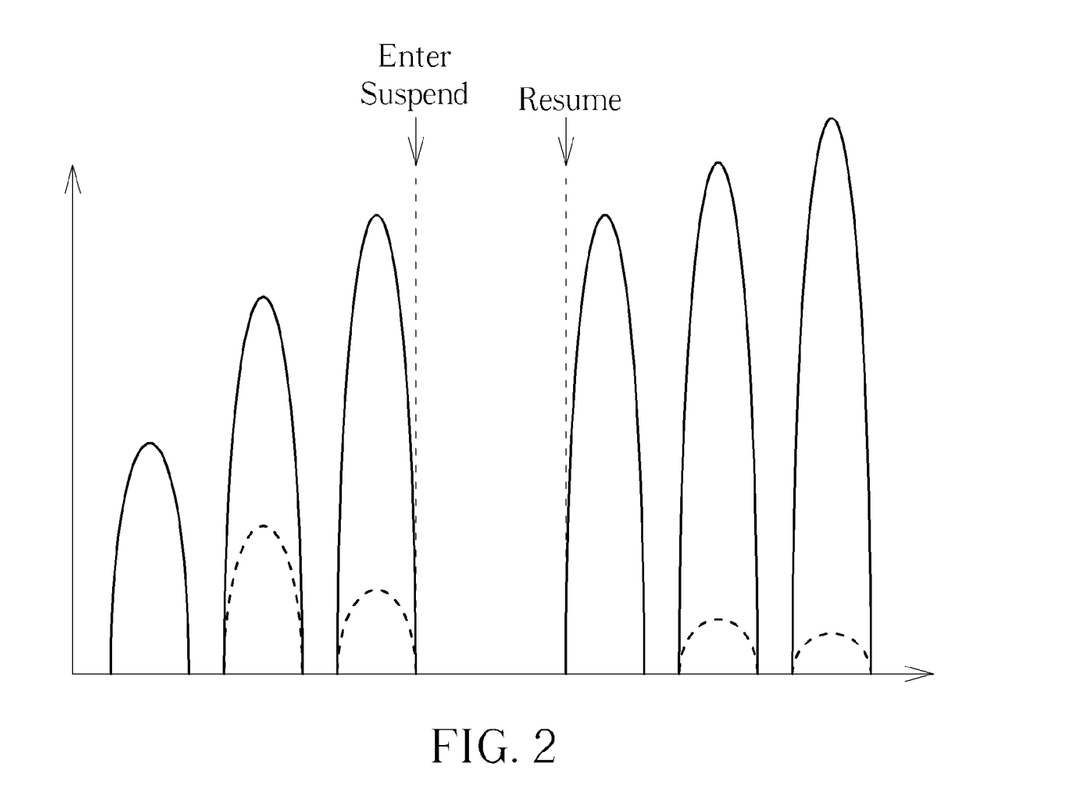
FIG. 2 is a schematic diagram of waveforms of a suspending in a programming process for a memory array in the prior art.

FIG. 2 is a schematic diagram of waveforms of a suspending operation in a programming process for a memory array in the prior art. As can be seen, a suspend command received when the programming process is performing, the memory array will serve the read request to other pages, and then resume to continuously the programming process.

However, when the programming process is suspended during one programming voltage pulse, the resume of the program process may cause the programming channel to negative. In other words, regarding the normal program, those threshold voltages Vt of the bit-cell are left shift in time. As a result, holes will be accumulated in the channel and also the charge trap layer. Moreover, the longer of the suspend time would cause the more accumulating, which makes the bit-cell to be more easy to pass the first verification after resuming, even if the bit-cell is not programmed well.

On the other hand, if the read command is in a queue and performed after the programming process finishes, the read time will be pended until a page is finished the programming and verification. Therefore, the read latency will be increased as the number of bit-cells of the page increases.

Figure 3:
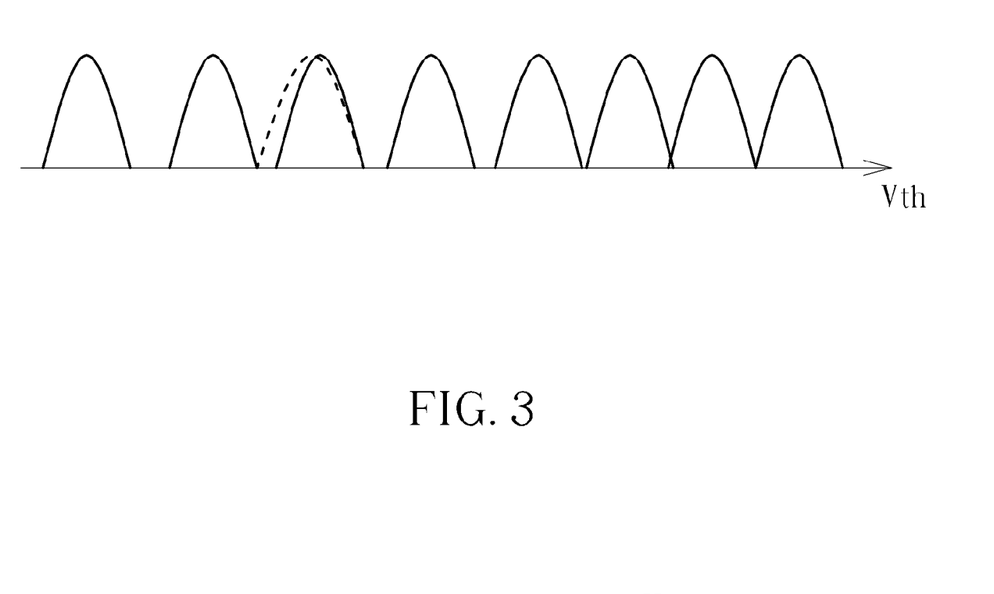
FIG. 3 is a schematic diagram of waveforms of programming voltage pulses in a programming process in the prior art.

For example, FIG. 3 is a schematic diagram of waveforms of programming voltage pulses in a programming process in the prior art. As shown in FIG. 3, a suspend command received by the memory array, the first verification after resuming is easy to pass because the threshold voltages Vt is shifted (shown in dot line) comparing with the threshold voltages Vt without suspending (shown in bold line.) This will make the read after the program to have more fail bits.

Different from the prior art, a control method of the present disclosure performs the programming process for the memory array by inserting a discharge stage, which follows a programming stage, when the memory receives a suspend command in the programming stage. Thereby, the false error rate in the programming process is improved.

Figure 4:
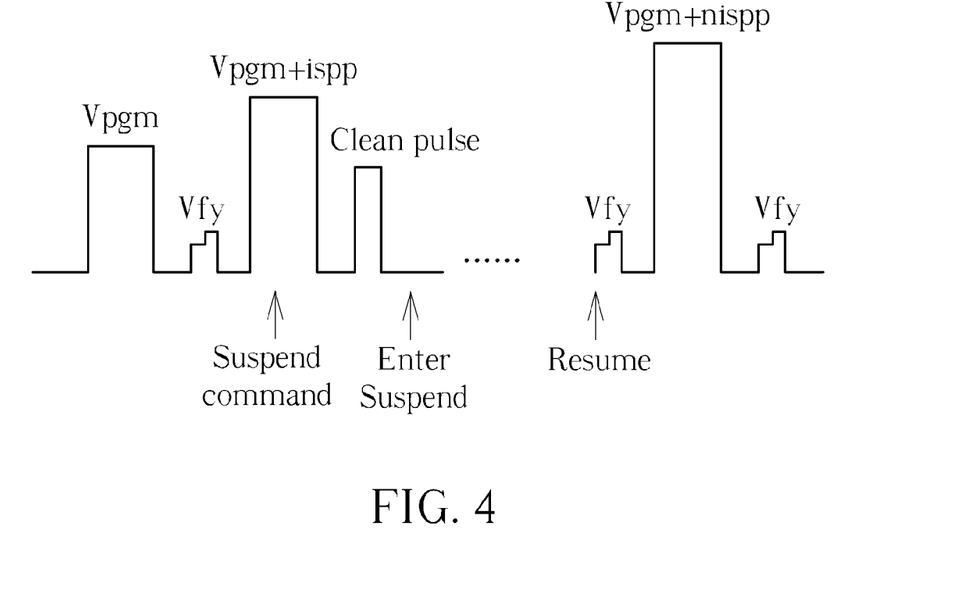
FIG. 4 is a schematic diagram of waveforms of a programming process for a memory array according to an embodiment of the present disclosure.

More specifically, please refer to FIG. 4, which is a schematic diagram of waveforms of a programming process for a memory array according to an embodiment of the present disclosure. As can be seen, the clean voltage pulse, which follows one programming voltage pulse, is impulsed to the memory array, and then the memory array transfers the programming stage to the suspend stage to serve other memory requests.

Practically, the voltage of the clean voltage pulse and its pulse width may be adjustable according to different utilization scenarios. In an embodiment, the voltage of the clean voltage pulse and its pulse width may be a fixed value by pre-determining, calibration, determined by a mapping table, or adjusted accordingly to fit the practical scenario, which are corresponding to the voltage, the current, the temperature, the age or their combination thereof. Those skilled in the art may make modifications of the decision rule and alterations accordingly, and not limited herein.

Figure 5A:
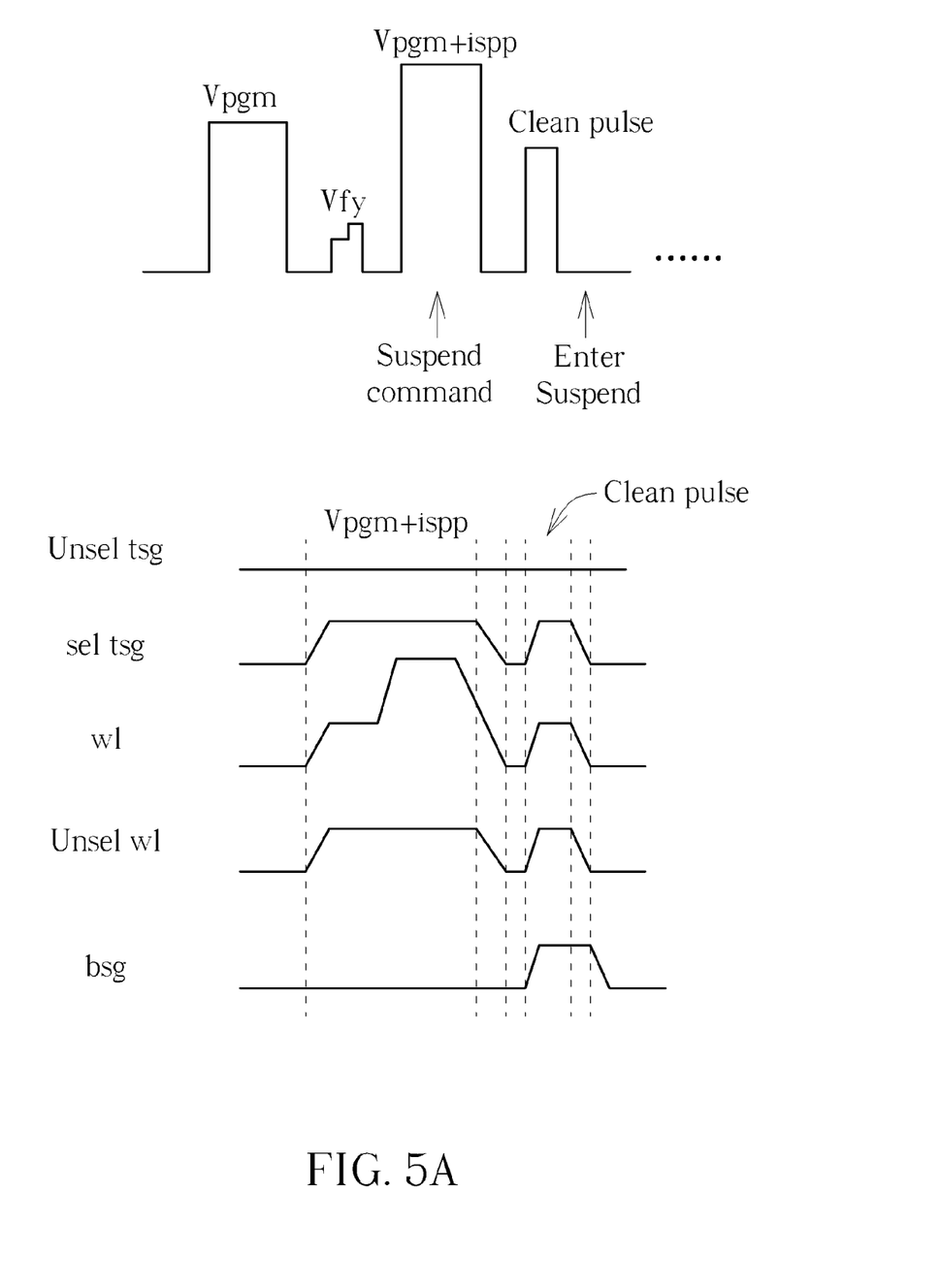
FIGS. 5A and 5B are schematic diagrams of waveforms of a programming process for a memory array according to embodiments of the present disclosure.

To implement the requirements of generating the clean voltage pulse, FIG. 5A illustrates a schematic diagram of waveforms of a programming process for a memory array according to embodiments of the present disclosure. As shown in FIG. 5A, the bottom select gate line is enabled in the discharge stage, which may release the holes and prevent the bit-cell from mis-programmed.

As can be seen, the interface of a bit-cell of the memory array comprises a top select gate line, a bottom select gate line, a charge-trapping line, a common-source line, and a p-well line. In the programming stage, the programming waveform is inputted to store data in the form of logic 0 or logic 1. However, the interface of the memory array is not limited hereinabove, and those skilled in the art may make modifications and alterations according to the memory array in the whole system.

Figure 5B:
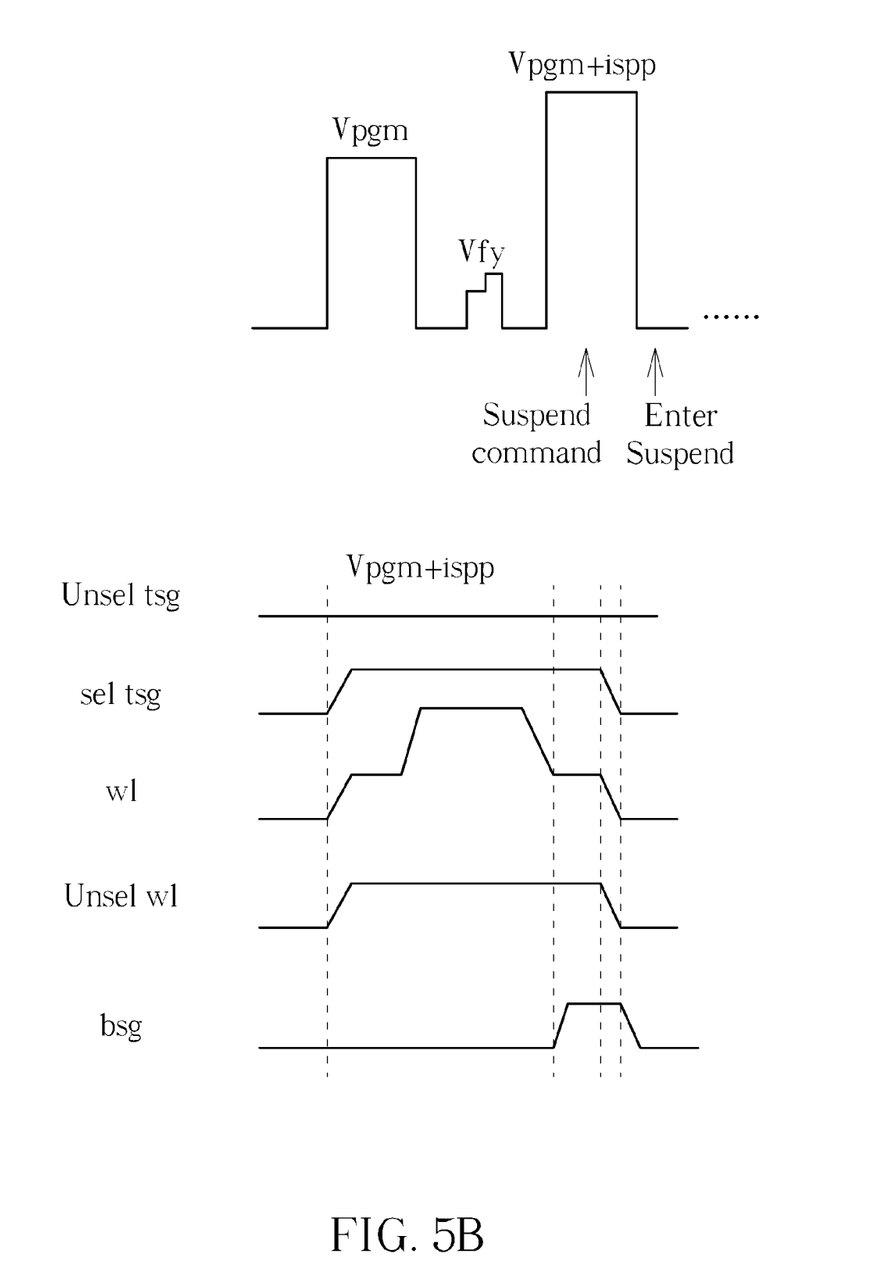

In addition, FIG. 5B illustrates a schematic diagram of waveforms of a programming process for a memory array according to embodiments of the present disclosure. As shown in FIG. 5B, the bottom select gate line may be enabled early to the end of the programming stage. That is, the discharge stage may be shortly overlapped with the programming stage, to save the transient time from the programming stage to the suspended stage.

Figure 6:
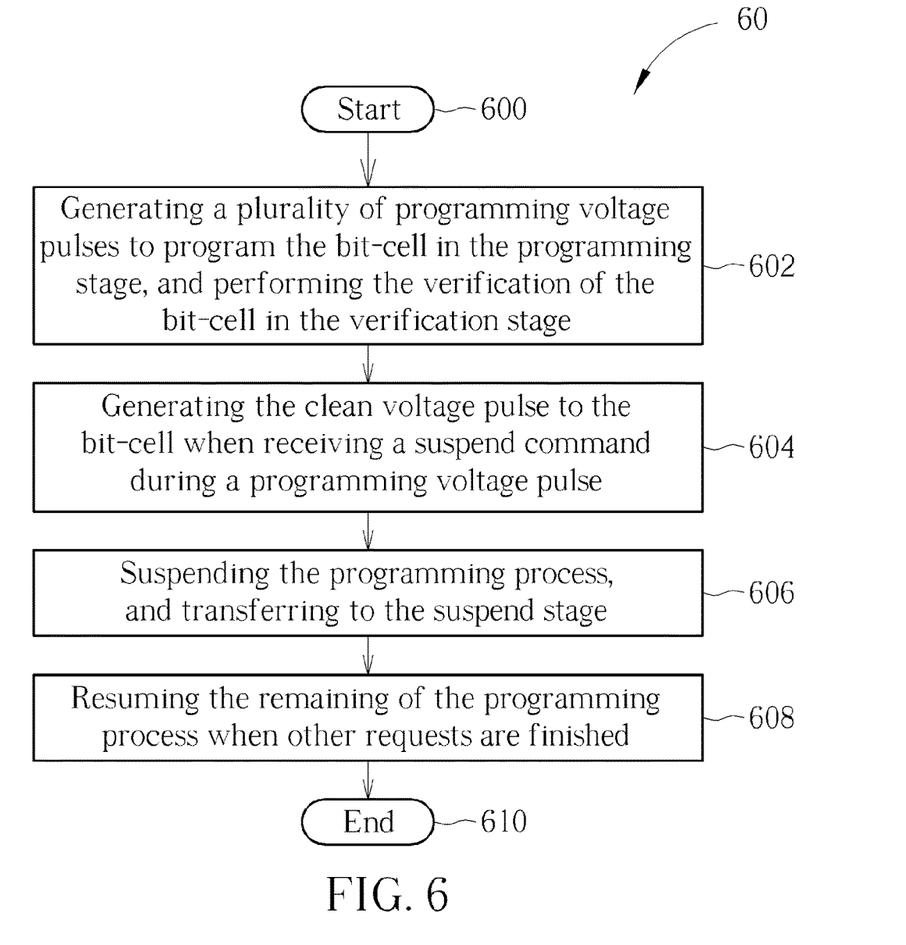
FIG. 6 is a schematic diagram of a programming process 60 for a memory system according to an embodiment of the present disclosure.

The operation of the programming process may be summarized to a programming process 60, as shown in FIG. 6. The programming process 60 comprises the following steps:

Step 600: Start.

Step 602: Generating a plurality of programming voltage pulses to program the bit-cell in the programming stage, and performing the verification of the bit-cell in the verification stage.

Step 604: Generating the clean voltage pulse to the bit-cell when receiving a suspend command during a programming voltage pulse.

Step 606: Suspending the programming process, and transferring to the suspend stage.

Step 608: Resuming the remaining of the programming process when other requests are finished.

Step 610: End.

In Step 602, the programming process 60 may be modified to have a verification stage to follow a plurality of programming stages in sequence. For example, in an embodiment, the programming process 60 may comprise a first programming stage, a second programming stage, and followed by a verification stage.

In Step 604, the suspend command may modified to be queued after one verification of a programming voltage pulse is finished; that is, the suspend stage may be transferred from the programming stage or the verification stage. However, in Step 608, the remaining of the programming process should be performed continually. For example, if the memory array is suspended in the programming stage, then the remaining of the programming process starts with a verification stage in Step 608; if the memory array is suspended in the verification stage, then the remaining of the programming process starts with a programming stage in Step 608.

In addition, In Step 604, the clean voltage pulse may be generated by a dummy programming voltage pulse, a dummy programming command, or other way, which may discharge the holes to the bit-cell in the programming process being suspended for the memory system.

The detailed operations of the programming progress 60 may be referred to the foregoing description, which is not narrated herein for brevity.

Figure 7:
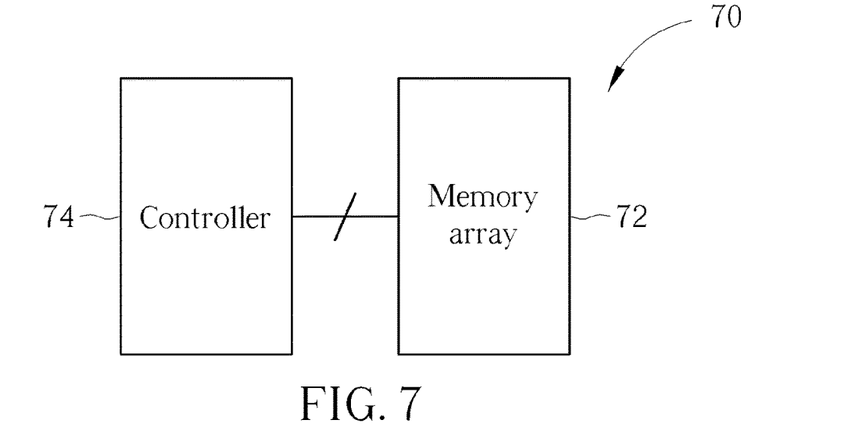
FIG. 7 is a schematic diagram of a memory system 70 according to an embodiment of the present disclosure.

FIG. 7 is a schematic diagram of a memory system 70 according to an embodiment of the present disclosure. The memory system 70 includes a memory array 72, which is configured to store data in the form of logic 0 or logic 1, and a controller 74, which is configured to receive external commands and to toggle the waveforms to control the memory array 72. The bottom select gate line is enabled by the controller 74 toggling the waveforms or receives an external command. In an embodiment, the controller 74 may comprise a processor and a storage unit. The storage unit may store a program code to instruct the processor to perform the function of toggling the waveforms of the present disclosure. In addition, the processor may be a processing unit, an application processor (AP) or a digital signal processor (DSP), wherein the processing unit may be a central processing unit (CPU), a graphics processing unit (GPU) or a tensor processing unit (TPU), and not limited thereto. The storage unit may be a memory, which may be a non-volatile memory, such as an electrically erasable programmable read-only memory (EEPROM) or a flash memory, and not limited thereto.

In an embodiment, the memory system 70 may generate the programming waveform in discharge stage by generating a dummy programming command. In an embodiment, each of the programming voltage pulse may be followed by the dummy programming command. Notably, the present disclosure is not limited to generating a dummy programming voltage pulse to the bit-cell of the memory, and those skilled in the art may discharge the bit-cell appropriately, for example, by enabling the bottom select gate line, or combine the advantages of the methods mentioned above. The method of controlling is known to those skilled in the art, which is not narrated herein for brevity.

In addition, the usage as the memory is suspended is not limited to reading. In fact, those skilled in the art may, according to different utilization scenarios, substitute the read command and the read operation with other memory access requests and operations corresponding to the other memory access requests respectively.

Notably, the embodiments stated in the above are utilized for illustrating the concept of the present disclosure. Those skilled in the art may make modifications and alterations accordingly, and not limited herein. Hence, as long as a discharge stage is inserted after the programming stage to avoid holes accumulated to the bit-cell of the memory array in the programming process being suspended for a memory system, the requirement of the present application is satisfied.

In summary, by avoiding holes accumulated to the bit-cell in the programming process being suspended for a memory system, the control method and controller of program suspending and resuming for memory of the present application have advantages of reducing the fail bit counts in the programming process, which may increase the robustness of the memory.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A memory system, comprising:
a memory cell array; and
a controller coupled to the memory cell array and configured to:
control applying a first program voltage to a word line to program memory cells in the memory cell array, the memory cells being coupled to the word line; and
in response to receiving a suspend command, control applying a positive bias discharge voltage to the word line when the first program voltage ramps down.

2. The memory system of claim 1, wherein the discharge voltage avoids holes accumulated at the memory cells.

3. The memory system of claim 1, wherein the first program voltage is higher than the discharge voltage.

4. The memory system of claim 1, wherein the suspend command comprises a read command.

5. The memory system of claim 1, wherein the controller is further configured to, in response to completion of an operation caused by the suspend command, control applying a verify voltage to the word line.

6. The memory system of claim 1, wherein the controller is further configured to, in response to completion of an operation caused by the suspend command, control applying a second program voltage to the word line.

7. The memory system of claim 6, wherein the second program voltage is higher than the first program voltage.

8. The memory system of claim 6, wherein the controller is further configured to, in response to the completion of the operation caused by the suspend command, control applying a verify voltage to the word line before applying the second program voltage.

9. The memory system of claim 1, further comprising a select gate line coupled to the memory cell array, wherein the controller is further configured to, in response to receiving the suspend command, control applying a positive bias select gate line voltage to the select gate line.

10. The memory system of claim 9, wherein the discharge voltage overlaps the select gate line voltage.

11. The memory system of claim 9, wherein the discharge voltage is applied before the select gate line voltage ramps down.

12. A method for programming a memory cell array, comprising:
   applying a first program voltage to a word line to program memory cells in the memory cell array, the memory cells being coupled to the word line; and
   in response to receiving a suspend command, applying a positive bias discharge voltage to the word line when the first program voltage ramps down.

13. The method of claim 12, wherein the discharge voltage avoids holes accumulated at the memory cells.

14. The method of claim 12, wherein the first program voltage is higher than the discharge voltage.

15. The method of claim 12, further comprising in response to completion of an operation caused by the suspend command, applying a verify voltage to the word line.

16. The method of claim 12, further comprising, in response to completion of an operation caused by the suspend command, applying a second program voltage higher than the first program voltage to the word line.

17. The method of claim 16, further comprising, in response to the completion of the operation caused by the suspend command, applying a verify voltage to the word line before applying the second program voltage.

18. The method of claim 12, further comprising, in response to receiving the suspend command, control applying a positive bias select gate line voltage to a select gate line coupled to the memory cell array.

19. The method of claim 18, wherein the discharge voltage overlaps the select gate line voltage.

20. The method of claim 18, wherein the discharge voltage is applied before the select gate line voltage ramps down.

* * * * *